(12) United States Patent
Yin et al.

(10) Patent No.: US 7,924,333 B2
(45) Date of Patent: Apr. 12, 2011

(54) METHOD AND APPARATUS PROVIDING SHARED PIXEL STRAIGHT GATE ARCHITECTURE

(75) Inventors: Zhiping Yin, Boise, ID (US); Xiaofeng Fan, Boise, ID (US)

(73) Assignee: Aptina Imaging Corporation, George Town (KY)

( * ) Notice: Subject to any disclaimer, the term of this patent is extended or adjusted under 35 U.S.C. 154(b) by 446 days.

(21) Appl. No.: 11/892,004

(22) Filed: Aug. 17, 2007

(65) Prior Publication Data
US 2009/0046189 A1    Feb. 19, 2009

(51) Int. Cl.
*H04N 3/14* (2006.01)
*H04N 5/335* (2006.01)
*H01L 27/00* (2006.01)

(52) U.S. Cl. .................................... 348/308; 250/208.1

(58) Field of Classification Search .................. 348/294, 348/301, 302, 308
See application file for complete search history.

(56) References Cited

U.S. PATENT DOCUMENTS

| | | | |
|---|---|---|---|
| 5,917,547 A | 6/1999 | Merrill et al. | |
| 6,252,218 B1 | 6/2001 | Chou | |
| 6,486,913 B1 | 11/2002 | Afghahi et al. | |
| 6,867,806 B1 | 3/2005 | Lee et al. | |
| 6,933,974 B2 | 8/2005 | Lee | |
| 7,244,918 B2 * | 7/2007 | McKee et al. | 250/208.1 |
| 7,244,920 B2 * | 7/2007 | Kim et al. | 250/208.1 |
| 7,443,437 B2 * | 10/2008 | Altice et al. | 348/296 |
| 7,639,298 B2 * | 12/2009 | Oita et al. | 348/308 |
| 2002/0134917 A1 | 9/2002 | Ang | |
| 2004/0016869 A1 | 1/2004 | Campbell et al. | |
| 2004/0069930 A1 | 4/2004 | Zarnowski et al. | |
| 2004/0080643 A1 | 4/2004 | Peng | |
| 2005/0110884 A1 * | 5/2005 | Altice et al. | 348/302 |
| 2005/0128327 A1 * | 6/2005 | Bencuya et al. | 348/308 |
| 2005/0164421 A1 | 7/2005 | Patrick et al. | |
| 2006/0027843 A1 | 2/2006 | Ogura et al. | |
| 2006/0038904 A1 * | 2/2006 | Kudoh | 348/308 |
| 2006/0044439 A1 * | 3/2006 | Hiyama et al. | 348/308 |
| 2006/0077273 A1 | 4/2006 | Lee et al. | |
| 2006/0118837 A1 | 6/2006 | Choi | |
| 2006/0132633 A1 * | 6/2006 | Nam et al. | 348/308 |
| 2006/0146158 A1 | 7/2006 | Toros et al. | |
| 2006/0164533 A1 | 7/2006 | Hsieh et al. | |

(Continued)

FOREIGN PATENT DOCUMENTS
EP    0 707 417 A2    4/1996
(Continued)

OTHER PUBLICATIONS

Cheng, H. et al., "An ultra-low dark current CMOS image sensor cell using n/sup +/ ring reset", Nat. Tsing Hua Univ., Hsinchu, Taiwan Electron Device Letters, IEEE, Publication Date: Sep. 2002; vol. 23 , Issue: 9; pp. 538-540, http://ieeexplore.ieee.org/search/srchabstract.jsp?arnumber=1028992&isnumber=22109 &punumber=55&k2dockey=1028992@ieeejrns &query=%28+%28+pixel%3Cin%3Eab+%29+%3Cand%3E+%28+layout%3Cin%3Eab+%29+%29&pos=7 (abstract only).

(Continued)

*Primary Examiner* — John M Villecco

(57) ABSTRACT

Methods and apparatuses using four-way-shared readout circuits to increase pixel fill factor. Embodiments consolidate circuits from several pixels, reducing the number of components in each pixel and this increasing the fill factor of each pixel. Additionally, embodiments use "straight gate" transfer gates to increase the readout speed and symmetry of the smaller pixels.

22 Claims, 11 Drawing Sheets

U.S. PATENT DOCUMENTS

| | | | |
|---|---|---|---|
| 2006/0170804 | A1 | 8/2006 | Kwon |
| 2006/0208163 | A1* | 9/2006 | Manabe et al. ............ 250/208.1 |
| 2006/0231875 | A1 | 10/2006 | Patrick et al. |
| 2006/0256221 | A1 | 11/2006 | Mckee et al. |
| 2006/0273240 | A1 | 12/2006 | Guidash et al. |
| 2006/0284177 | A1 | 12/2006 | Hynecek |
| 2007/0023797 | A1 | 2/2007 | Wu et al. |
| 2007/0023798 | A1 | 2/2007 | McKee |
| 2007/0034884 | A1 | 2/2007 | McKee |
| 2007/0040922 | A1 | 2/2007 | McKee et al. |
| 2007/0045514 | A1 | 3/2007 | McKee et al. |
| 2007/0046796 | A1 | 3/2007 | McKee |
| 2007/0058062 | A1 | 3/2007 | Ohta |
| 2007/0084986 | A1 | 4/2007 | Yang et al. |
| 2007/0153107 | A1 | 7/2007 | Boettiger et al. |
| 2007/0177044 | A1* | 8/2007 | Maruyama et al. ........... 348/308 |
| 2008/0225148 | A1* | 9/2008 | Parks ............................. 348/308 |
| 2008/0303930 | A1* | 12/2008 | Kuroda et al. ................ 348/308 |
| 2009/0046189 | A1 | 2/2009 | Yin et al. |
| 2009/0090845 | A1* | 4/2009 | Yin et al. ................... 250/208.1 |

FOREIGN PATENT DOCUMENTS

| | | | |
|---|---|---|---|
| EP | 1 026 747 | A2 | 8/2000 |
| EP | 1 804 297 | A1 | 7/2007 |
| JP | 2003-32556 | A | 1/2003 |
| JP | 2005-183527 | A | 7/2005 |
| JP | 2005-318544 | A | 11/2005 |
| JP | 2006-54276 | | 2/2006 |
| JP | 2006-108497 | A | 4/2006 |
| KR | 10-2004-0092809 | A | 11/2004 |
| KR | 10-0598015 | | 6/2006 |
| TW | 451584 | B | 8/2001 |
| WO | WO 03/071787 | A1 | 8/2003 |
| WO | WO 2006/122068 | A2 | 11/2006 |
| WO | WO 2007/024561 | A1 | 3/2007 |
| WO | WO 2007/024855 | A2 | 3/2007 |
| WO | WO 2007/027728 | A2 | 3/2007 |

OTHER PUBLICATIONS

Yasuda, T. et al., "Adaptive-integration-time image sensor with real-time reconstruction function", Dept. of Electr. Eng., Tokyo Univ. of Sci., Japan Electron Devices, IEEE Transactions, Publication Date: Jan. 2003; vol. 50 , Issue: 1; pp. 111-120, http://ieeexplore.ieee.org/search/srchabstract.jsp?arnumber=1185171&isnumber=26588 &punumber=16&k2dockey=1185171@ieeejrns &query=%28+%28+pixel%3Cin%3Eab+%29+%3Cand%3E+ %28+layout%3Cin%3Eab+%29+%29&pos=6 (abstract only).

Bermak, A. et al., "A high fill-factor native logarithmic pixel: Simulation, design and layout optimization", Sch. of Eng. & Math, Edith Cowan Univ., Joondalup, WA, Australia; Circuits and Systems, 2000. Proceedings. ISCAS 2000 Geneva. The 2000 IEEE International Symposium, Publication Date: May 28-31, 2000; vol. 5; pp. 293-296 vol. 5, http://ieeexplore.ieee.org/iel5/6910/18623/00857422. pdf?tp=&arnumber857422&isnumber=18623 (abstract only).

Brown, J.J. et al., "An integrated, optically powered, optoelectronic 'smart' logic pixel for interconnection and computing applications", Hughes Res. Labs., Malibu, CA, USA ; Quantum Electronics, IEEE Journal, Publication Date: Feb. 1993 ; vol. 29 , Issue: 2; pp. 715-726, http://ieeexplore.ieee.org/search/srchabstract. isp?arnumber=199324&isnumber=5181&punumber=3 &k2dockey=199324@ieeejrns &query=%28+%28+pixel%3Cin%3Eab+%29+%3Cand%3 E+%28+layout%3Cin%3Eab+%29+%29&pos=8 (abstract only).

Iida, Y. et al., "Pixel structure and layout for CMOS active pixel image sensor", Publication: Proc. SPIE vol. 3301, p. 158-167, Solid State Sensor Arrays: Development and Applications II, Morley M. Blouke; Ed. Publication Date: Apr. 1998 http://www.spie.org/scripts/abstract.pl?bibcode=1998SPIE.3301..1581.

Chow, H. et al., "New Pixel-Shared Design and Split-Path Readout of CMOS Image Sensor Circuits," Institute of Semiconductor Technology, Change Gung University, Taoyuan, Circuits and Systems, 2002, ISCAS 2002, IEEE International Symposium, vol. 4, pp. IV-49-IV-52, Aug. 7, 2002, http://ieeexplore.ieee.org/xpls/abs_all. jsp?arnumber=1010385.

Mendis, S. et al., "Progress in CMOS Active Pixel Image Sensors," Center for Space Microelectronics Technology Jet Propulsion Laboratory, California Institute of Technology, Pasadena, CA, USA, Proceedings of the SPIE, vol. 2172, pp. 19-29, May 1994, Charge-Coupled Devices and Solid State Optical Sensors IV, http://trs-new. jpl.nasa.gov/dspace/bitstream/2014/32570/1/94-0315.pdf.

Miyatake, S. et al., "Transversal-Readout Architecture for CMOS Active Pixel Image Sensors," IEEE Transactions on Electron Devices, vol. 50, No. 1, pp. 121-129, Jan. 2003, http://ieeexplore. ieee.org/xpls/abs_all.jsp?arnumber=1185172.

Kemeny, S. et al., "CMOS Active Pixel Sensor Array with Programmable Multiresolution Readout," Jet Propulsion Laboratory, California Institute of Technology, Pasadena, CA, USA,1995, http://trs-new. jpl.nasa.gov/dspace/bitstream/2014/29882/1/95-0698.pdf.

Kwok, T. et al., "Readout Circuit for CMOS Active Pixel Image Sensor," Department of Engineering, Cambridge University, UK, Mar. 28, 2002, vol. 38, Issue 7, pp. 317-318, http://ieeexplore.org/xpls/abs_all.jsp?arnumber=995481.

\* cited by examiner

US 7,924,333 B2

METHOD AND APPARATUS PROVIDING SHARED PIXEL STRAIGHT GATE ARCHITECTURE

FIELD OF THE INVENTION

The embodiments described herein relate generally to imaging devices and, more specifically, to methods and apparatuses for increasing the photosensitive area and fill factor of each pixel in an imaging device.

BACKGROUND OF THE INVENTION

Solid state imaging devices, including charge coupled devices (CCD), complementary metal oxide semiconductor (CMOS) imaging devices, and others, have been used in photo imaging applications. A solid state imaging device circuit includes a focal plane array of pixels as an image sensor, each pixel including a photosensor, which may be a photogate, a photoconductor, a photodiode, or other photosensor having a doped region for accumulating photo-generated charge. For CMOS imaging devices, each pixel has a charge storage region, formed on or in the substrate, which is connected to the gate of an output transistor that is part of a readout circuit. The charge storage region may be constructed as a floating diffusion region. In some CMOS imaging devices, each pixel may further include at least one electronic device such as a transistor for transferring charge from the photosensor to the storage region and one device, also typically a transistor, for resetting the storage region to a predetermined charge level.

In a CMOS imaging device, the active elements of a pixel perform the necessary functions of: (1) photon to charge conversion; (2) accumulation of image charge; (3) resetting the storage region to a known state; (4) transfer of charge to the storage region; (5) selection of a pixel for readout; and (6) output and amplification of a signal representing pixel charge. Photo charge may be amplified when it moves from the initial charge accumulation region to the storage region. The charge at the storage region is typically converted to a pixel output voltage by a source follower output transistor.

CMOS imaging devices of the type discussed above are generally known as discussed, for example, in U.S. Pat. No. 6,140,630, U.S. Pat. No. 6,376,868, U.S. Pat. No. 6,310,366, U.S. Pat. No. 6,326,652, U.S. Pat. No. 6,204,524, and U.S. Pat. No. 6,333,205, assigned to Micron Technology, Inc.

A typical four transistor (4T) CMOS image sensor pixel 100 is shown in FIG. 1. The pixel 100 includes a photosensor 102 (e.g., photodiode, photogate, etc.), transfer gate 104, floating diffusion region FD, reset transistor 106, source follower transistor 110, and row select transistor 112. The photosensor 102 is connected to the floating diffusion region FD by the transfer gate 104 when the transfer gate 104 is activated by a transfer control signal TX.

The reset transistor 106 is connected between the floating diffusion region FD and a voltage supply line 206. A reset control signal RST is used to activate the reset transistor 106, which resets the floating diffusion region FD to the voltage supply line 206 level as is known in the art.

The source follower transistor 110 is connected to the floating diffusion region FD and is connected between the voltage supply line 206 and the row select transistor 112. The source follower transistor 110 converts the charge stored at the floating diffusion region FD into an electrical output voltage signal VOUT. The row select transistor 112 is controllable by a row select signal ROW for selectively connecting the source follower transistor 110 and its output voltage signal VOUT to a column line of a pixel array.

In order to capture images with greater resolution while also maintaining a small image sensor, it is desirable to design image sensors with a large number of relatively small pixels. As pixels become smaller, however, many of the transistors responsible for reading out the pixel signal, such as transistors 106, 110, and 112 in FIG. 1, cannot be made smaller and begin to take up most of the space allocated to each pixel 100. Consequently, the photosensor 102 becomes smaller while more of the pixel area is used by the pixel transistors, such that, the pixel's 100 fill factor, which is the percentage of a pixel that is photosensitive, is reduced. As photosensor size and pixel fill factor shrink, the amount of light that is converted to a signal within each pixel decreases as well. Another problem relates to the metal routing layers used to convey signals e.g., control signals, for the readout circuits between the various transistors of the pixel. As pixels are made smaller, these metal routing layers, which are located in metal layers above the pixel, become more obstructive to light that would otherwise reach the photosensor 102. Accordingly, there is a need for a pixel architecture that allows for smaller pixels with higher fill factors.

DETAILED DESCRIPTION OF THE INVENTION

In the following detailed description, reference is made to the accompanying drawings which form a part hereof, and in which is shown by way of illustration specific embodiments that may be practiced. These embodiments are described in sufficient detail to enable those of ordinary skill in the art to make and use them, and it is to be understood that structural, logical, or procedural changes may be made to the specific embodiments disclosed.

The terms "semiconductor substrate" and "substrate" are to be understood to include any semiconductor-based structure. The semiconductor structure should be understood to include silicon, silicon-on-insulator (SOI), silicon-on-sapphire (SOS), silicon-germanium, doped and undoped semiconductors, epitaxial layers of silicon supported by a base semiconductor foundation, and other semiconductor structures. When reference is made to the substrate in the following description, previous process steps may have been utilized to form regions or junctions in or over the base semiconductor or foundation.

The term "pixel," as used herein, refers to a photo-element unit cell containing at least a photosensor for converting photons to an electrical signal. For purposes of illustration, a single representative four-way-shared pixel block is illustrated and described herein; however, typically a plurality of like pixels and blocks are included in an array. Accordingly, the following detailed description is not to be taken in a limiting sense. Embodiments described herein provide a pixel array architecture and a method of fabricating the same where the pixels share a readout circuit to increase fill factor in each pixel.

In the following description, the embodiments are described in relation to a CMOS imaging device for convenience; however, they have wider applicability to other pixels of other imaging devices. In addition, the photosensor of each pixel may be implemented as a pinned photodiode, a p-n junction photodiode, a Schottky photodiode, a photogate, or any other suitable photoconversion device.

Figure 1:
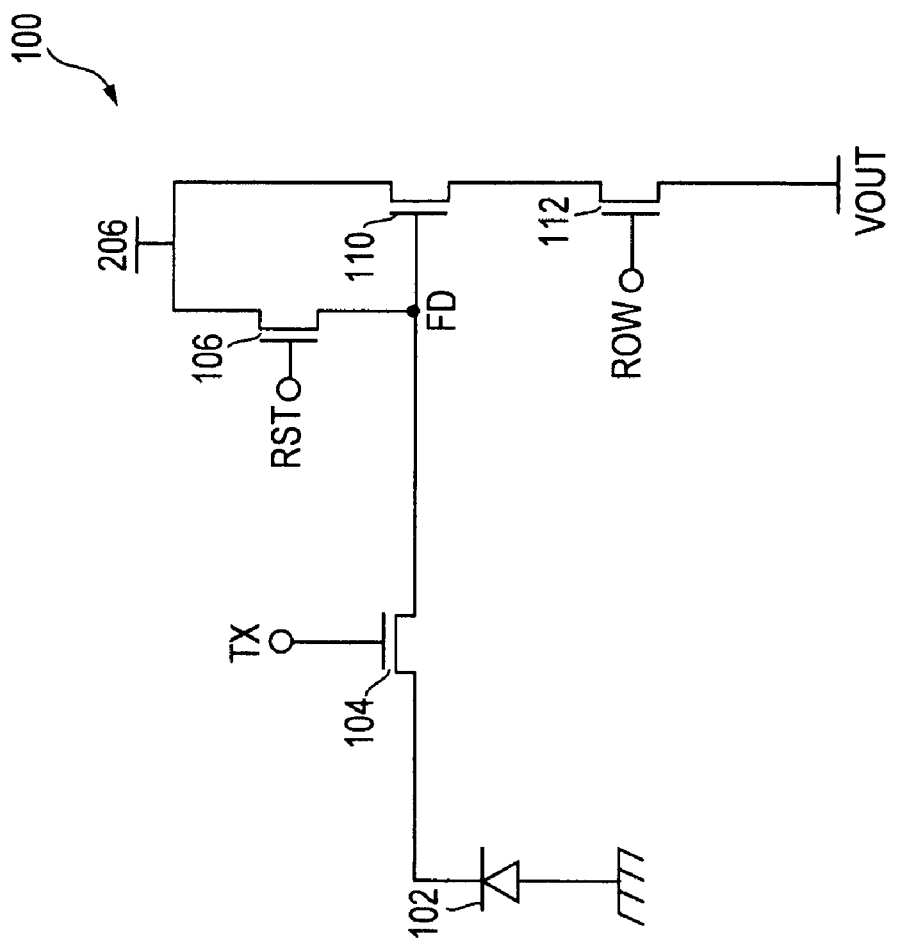
FIG. 1 is a schematic diagram of a conventional four-transistor pixel.
Figure 2A:
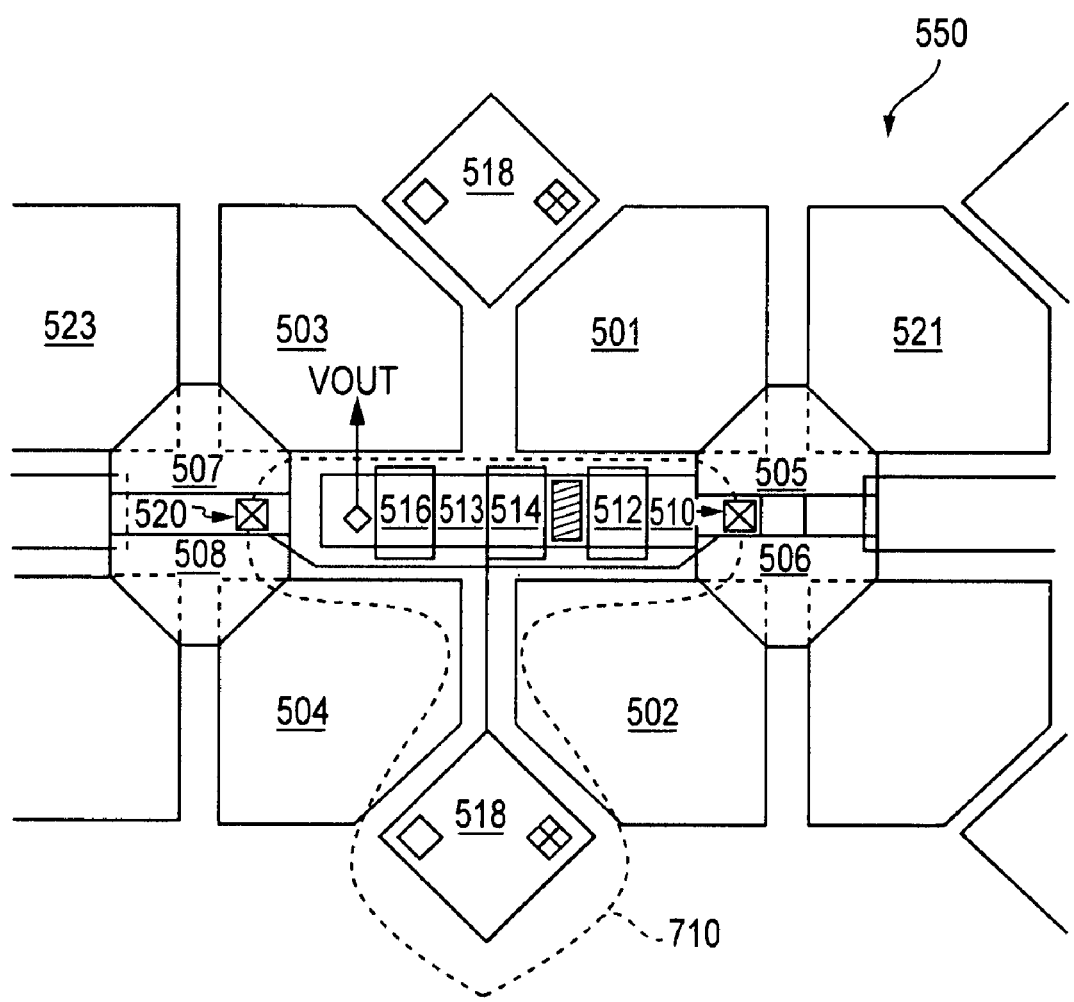
FIG. 2A is a top-down layout of a four-way-shared pixel block.

In order to decrease the pixel size within imaging devices, one technique known in the art is to share the readout circuitry between sets of pixels. For example, in what is known as four-way-shared pixel architecture, four photosensors 102 may each have an associated transfer gate 104, but all four pixels share a single reset transistor 106, source follower transistor 110, and row select transistor 112. FIG. 2A illustrates a top-down portion of a pixel array 550 according to a four-way shared-pixel architecture. In array 550, pixels have a non-uniform spacing throughout the array due to the location and arrangement of shared readout architecture, and the photosensors are also of irregular shape.

Figure 2B:
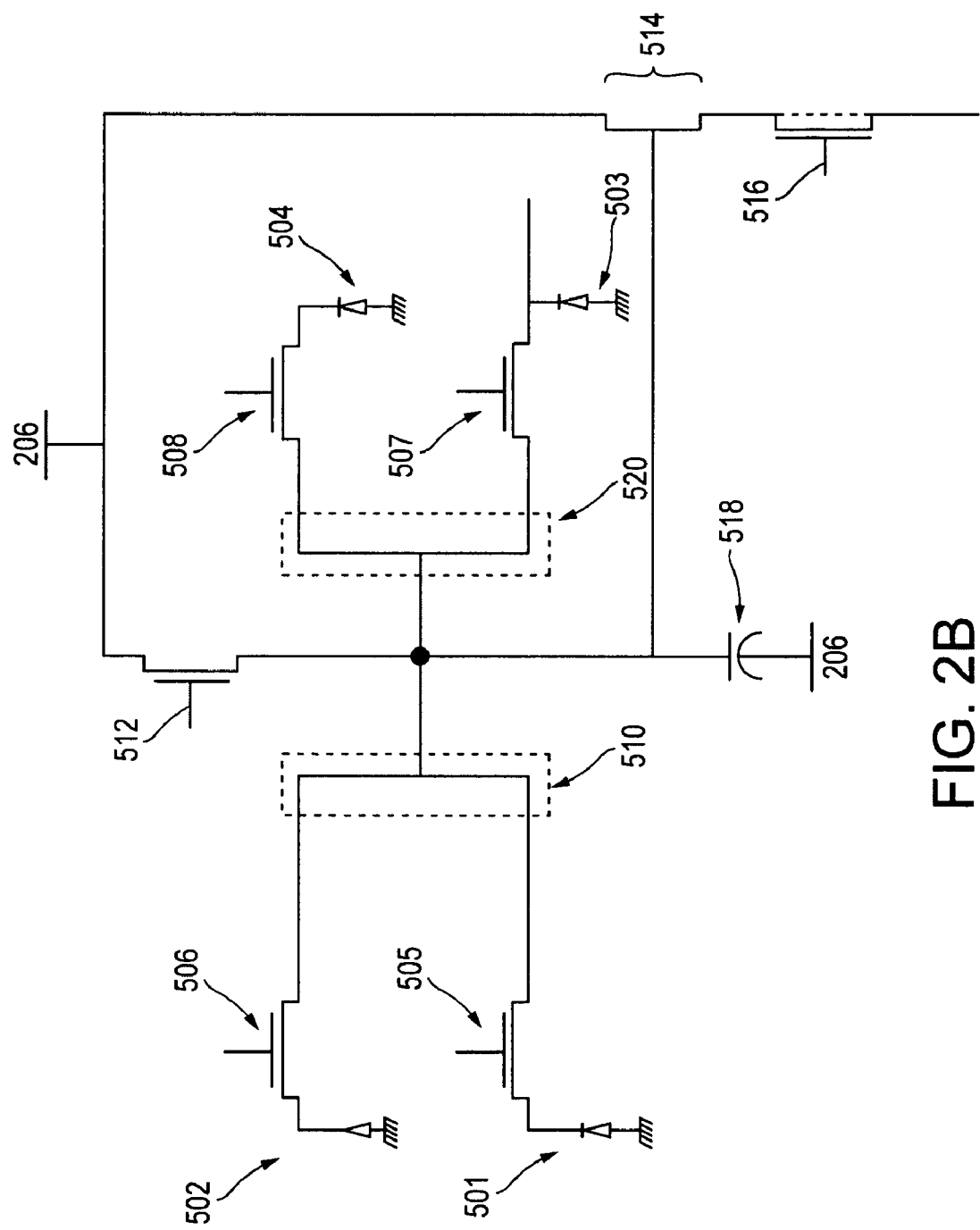
FIG. 2B is an electrical schematic of the four-way-shared pixel block shown in FIG. 2A.

As illustrated, the pixel array 550 has a plurality of pixels arranged in a set of four pixels, each having respective photosensors 501, 502, 503, 504. Each set of pixels sharing a readout circuit, such as the set of pixels containing photosensors 501, 502, 503, 504, is referred to herein as a pixel block. The illustrated pixel block has a shared architecture shown by dotted line area 710 in FIG. 2A. The shared architecture includes a linearly-extending trunk located within the area between the first pair of photosensors 501, 503 and the second pair of photosensors 502, 504. An electrical schematic diagram of the FIG. 2A pixel block is shown in FIG. 2B.

Each pixel has a transfer gate 505, 506, 507, 508. As shown, at least a portion of the transfer gates 505, 506, 507, 508 are at an angle with respect to the photosensors 501, 502, 503, 504. The transfer gates 505, 506, 507, 508 are shared among two adjacent pixels in a row. For example, column adjacent pixel photosensors 501 and 521 in the same row each share transfer gate 505, and column adjacent pixels 503 and 523 in the same row share transfer gate 507. The two illustrated pixels having associated photosensors 501, 521 share transfer gate 505, however they do not share a floating diffusion region or readout circuitry. Rather, this design has two row-adjacent pixels having photosensors 501, 502 sharing a first floating diffusion region 510, and two row-adjacent photosensors 503, 504 sharing a second floating diffusion region 520. The two floating diffusion regions 510, 520 are electrically connected to one another and to one electrode of an associated capacitor 518 through a first metallization layer formed above the surface of the pixel array 550. Each capacitor 518 is connected at another side to a contact receiving a source voltage from voltage supply line 206.

One reset transistor gate 512 is utilized for resetting the charges at both floating diffusion regions 510, 520 and the associated capacitor 518. To one side of the reset gate 512 is a source/drain region 513 that is capable of receiving a supply voltage from a voltage supply line 206. The four pixels having associated photosensors 501, 502, 503, 504 share a common readout circuit that includes a source follower transistor having a gate 514 and a row select transistor having a gate 516. The four pixels also share the capacitor 518, which can increase the storage capacity of the two associated floating diffusion regions 510, 520.

As described above, a significant problem associated with using smaller pixels is that the circuits for reading out the pixel signals take up more space than the photosensitive area of the pixel. In order to decrease the space used by readout circuits, embodiments consolidate circuits from several pixels, reducing the number of components in each pixel and thus increasing the fill factor of each pixel. Additionally, embodiments use "straight gate" transfer gates to increase the readout speed and symmetry of the smaller pixels.

Figure 3A:
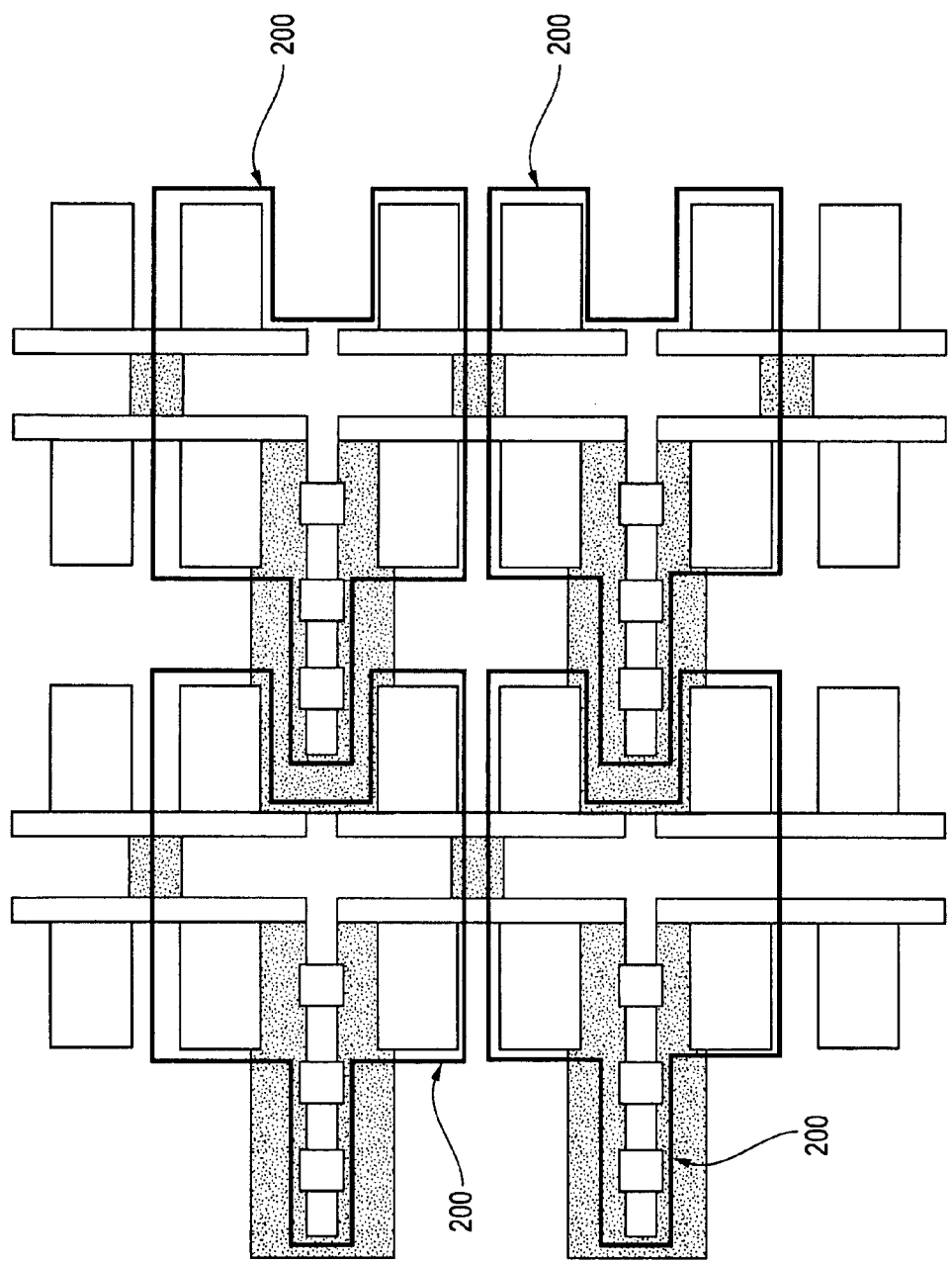
FIG. 3A is a top-down layout of four four-way-shared straight gate pixel blocks according to an embodiment described herein.
Figure 3B:
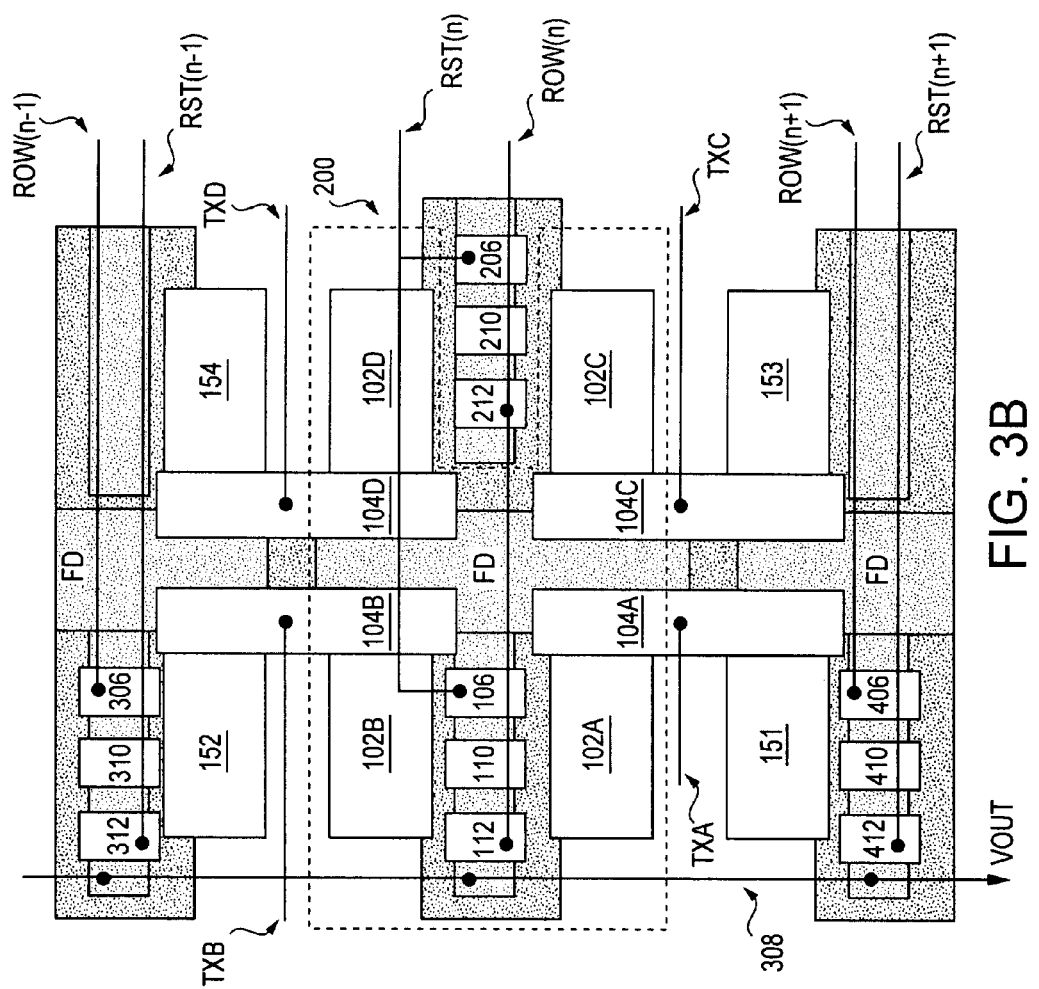
FIG. 3B is a top-down layout of a four-way-shared straight gate pixel block according to an embodiment described herein.

A top-down layout of an embodiment is shown in FIGS. 3A and 3B. FIG. 3A shows a top-down layout of four four-way-shared pixel blocks 200. As FIG. 3A shows, each four-way-shared pixel block 200 may contain four photosensors 102 as well as one set of readout circuitry 105 shared between them. Some elements may be shared between pixel blocks, such as transfer gates 104.

FIG. 3B shows a top-down layout of a pixel block 200 in the nth row of a pixel array and containing four photosensors 102A, 102B, 102C, 102D. Each photosensor 102A, 102B, 102C, 102D is connected via an individual transfer gate 104A, 104B, 104C, 104D, respectively, to the same floating diffusion region FD. Above pixel block 200 are two photosensors 152, 154 in the (n−1)th row of the pixel array. Below pixel block 200 are two photosensors 151, 153 in the (n+1)th row of the pixel array. These photosensors 151, 152, 153, 154 outside of pixel block 200 may be within other pixel blocks 200 above and below the illustrated pixel block 200. For illustration purposes, these pixel blocks are not shown. Similarly, transistors 206, 210, 212, 306, 310, 312 of other pixel blocks are shown to demonstrate one layout of an embodiment. The pixel blocks to which these transistors 206, 210, 212, 306, 310, 312 belong are not shown for purposes of illustration.

As shown, each transfer gate 104A, 104B, 104C, 104D may be shared with another photosensor (151, 152, 153, and 154) in another pixel block. The embodiment illustrated in FIG. 3B allows transfer gates 104A, 104B, 104C, 104D to be shared between adjacent photosensors that are in the same column. For example, photosensors 102A and 151 share transfer gate 104A. Similarly, photosensors 102B and 152 share transfer gate 104B, photosensors 102C and 153 share transfer gate 104C, and photosensors 102D and 154 share transfer gate 104D. Each individual transfer gate 104A, 104B, 104C, and 104D is controlled by a respective transfer control signal (TXA, TXB, TXC, TXD).

Unlike the design of FIGS. 2A, 2B, the transfer gates 104A, 104B, 104C, 104D are not angled relative to their respective photosensors 102A, 102B, 102C, 102D. Rather, the transfer gates 104A, 104B, 104C, 104D are straight gate transistors, extending along an entire edge of an associated photosensor 102A, 102B, 102C, 102D. Each transfer gate 104A, 104B, 104C, 104D is rectilinear, with a length and width. The length and width of the transfer gate 104A, 104B, 104C, 104D may be varied depending on the specific purpose of the pixel block 200. Wider or longer transfer gates 104A, 104B, 104C, 104D allow for more overlap between the transfer gates 104A, 104B, 104C, 104D and the photosensors 102A, 102B, 102C, 102D and/or the floating diffusion region FD. A larger overlap allows more charge transfer from the photosensor 102A, 102B, 102C, 102D to the floating diffusion region FD and in less time in comparison to other 4-way shared architectures. This, in turn, reduces overall lag time and increases the frame rate of the pixel block 200. The transfer gates 104A, 104B, 104C, 104D are aligned such that their length is oriented in the same direction as the pixel columns.

The floating diffusion region FD is connected to a reset transistor 106 and a source follower transistor 110. The reset transistor 106 is controlled by a signal line that carries the RST control signal (FIG. 4A) to reset the floating diffusion region FD using a voltage supply line (206 in FIG. 4A). The source follower transistor 110, which is also connected to the voltage supply line (206 in FIG. 4A), converts the charge stored on the floating diffusion region FD into an analog signal. The charge on the floating diffusion region FD will usually be an image signal charge (after a transfer gate 104A, 104B, 104C, 104D has been activated to allow charge from a photosensor 102A, 102B, 102C, 102D to reach the floating diffusion region FD) or a reset charge (after the reset transistor 106 has been activated to reset the floating diffusion region FD using the voltage supply line 206 in FIG. 4A). Both charges are necessary to determine the correct photosensor signal, which is calculated from the difference between the reset voltage and the signal voltage in accordance with known correlated double sampling methods. That process is detailed below in the discussion associated with FIGS. 4A, 4B, and 5. The analog signal is then passed through row select transistor 112 (controlled by the row select signal ROW(n) in FIG. 4A) and passed down the column readout line 308 as an output voltage signal VOUT for further processing.

The pixel array is read out one row at a time, beginning with ROW(0) and proceeding to ROW(N−1), where N is the number of rows of pixel blocks 200 in the pixel array. Each pixel block 200 in a row of the pixel array has a reset transistor 106, 206, 306 responsive to a RST signal for its row. Pixel block 200 (FIG. 3B), in the nth row of a pixel array, contains reset transistor 106, responsive to the same RST(n) signal as the reset transistor 206 in an adjacent pixel block in the nth row. Similarly, pixel block 200 contains a row select transistor 112, responsive to the same row select signal ROW(n) as the adjacent pixel block containing row select transistor 212. The reset transistor 306 and row select transistor 312 associated with photosensors 152, 154 in the (n−1)th row (above pixel block 200) are responsive to a different row select signal and reset signal, ROW(n−1) and RST(n−1). The photosensors 151, 153 in the (n+1)th row (below pixel block 200) may be associated with transistors responsive to a different row select signal ROW(n+1) and reset signal RST(n+1). All of the illustrated photosensors 102A-102D, 151-154 are read out as signal VOUT along a single column readout line 308 at different times (the readout procedure is described below with reference to FIG. 5). In the embodiment of FIG. 3B, there is a column readout line 308 for each column of pixel blocks 200 (that is, for every two columns of photosensors 102A-102D, 151-154).

One advantage of the disclosed technique is that all four photosensors 102A, 102B, 102C, 102D share a common floating diffusion region FD, in contrast to the separate, though electrically connected, floating diffusion regions 510, 520 of FIGS. 2A and 2B. The single floating diffusion region FD in FIG. 3B requires only a single contact to the source follower transistor 110, while the multiple floating diffusion regions 510, 520 require two. By using a single contact to the source follower transistor 110, the embodiment of FIGS. 3A and 3B requires less metal routing. This metal routing is located in layers above the photosensor (i.e., photosensors 102A-102D in FIG. 3B) and typically blocks or deflects some of the light that would otherwise be received and converted to charge. In the embodiment of FIGS. 3A and 3B, more light reaches the photosensors (photosensors 102A-102D in FIG. 3B) and is converted to useable charge, increasing the sensitivity of each pixel block 200.

The photosensors 102A-102D are susceptible to leaking some of the accumulated charge during and after the integration period. This leaked charge may result in electrical crosstalk, in which the charge is accumulated in a different pixel, creating an artificially high charge in that pixel. By increasing the available space surrounding each photosensor 102A-102D, 151-154, the embodiment of FIG. 3B may also include ground contacts connected to these components, e.g. photosensors 104A-104D to improve image uniformity. Without an in-pixel ground contact, each pixel is only grounded by ground contacts at the edge of the pixel array, which provide weaker grounding and create image uniformity problems. Adding in-pixel ground contacts increases image uniformity provides providing a strong ground to each pixel equally.

Contacts between the floating diffusion region FD and the source follower transistor 110 are another source of charge leakage, diminishing the sensitivity of pixel block 200 and potentially creating electrical crosstalk with nearby pixel blocks 200. By using a single contact, this leakage is reduced. Additionally, reducing the metal connections to the floating diffusion region FD reduces its capacitance, which increases the conversion gain of the pixel block 200. Conversion gain is the amount of voltage produced by the pixel block 200 (as output signal VOUT) relative to the charge accumulated in the floating diffusion region FD. A higher conversion ratio is desirable, as it increases the sensitivity of the pixel block 200. Another advantage of the disclosed technique is that the straight gate transfer gates 104A-104D overlap their associated photosensors 102A-102D over a greater area than the transfer gates of FIGS. 2A and 2B. Because each transfer gate 104A-104D has a larger overlapping region, the transfer of charge from the photosensors 102A-102D occurs quickly.

Figure 4A:
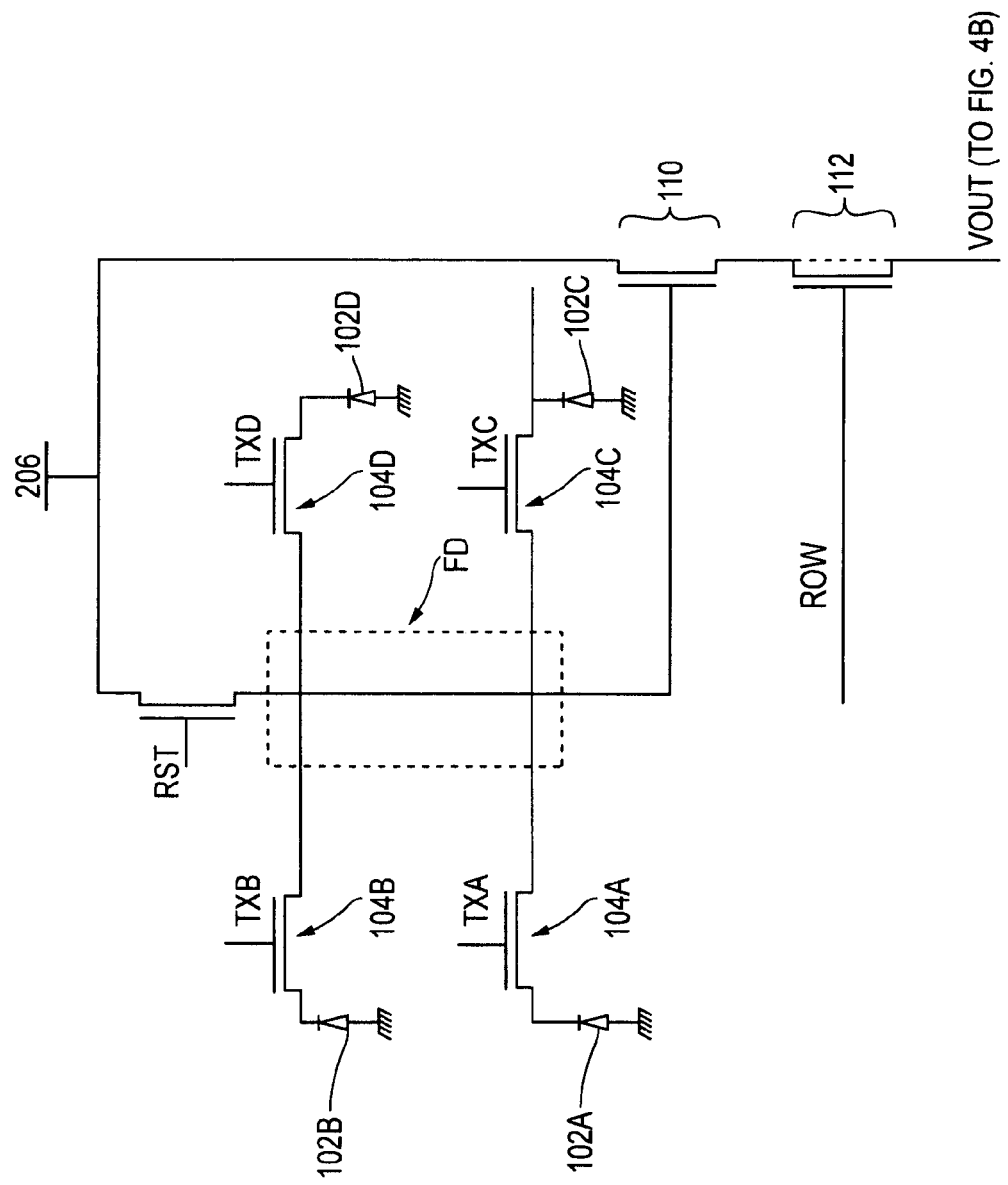
FIG. 4A is a schematic of a four-way-shared straight gate pixel block according to an embodiment described herein.
Figure 4B:
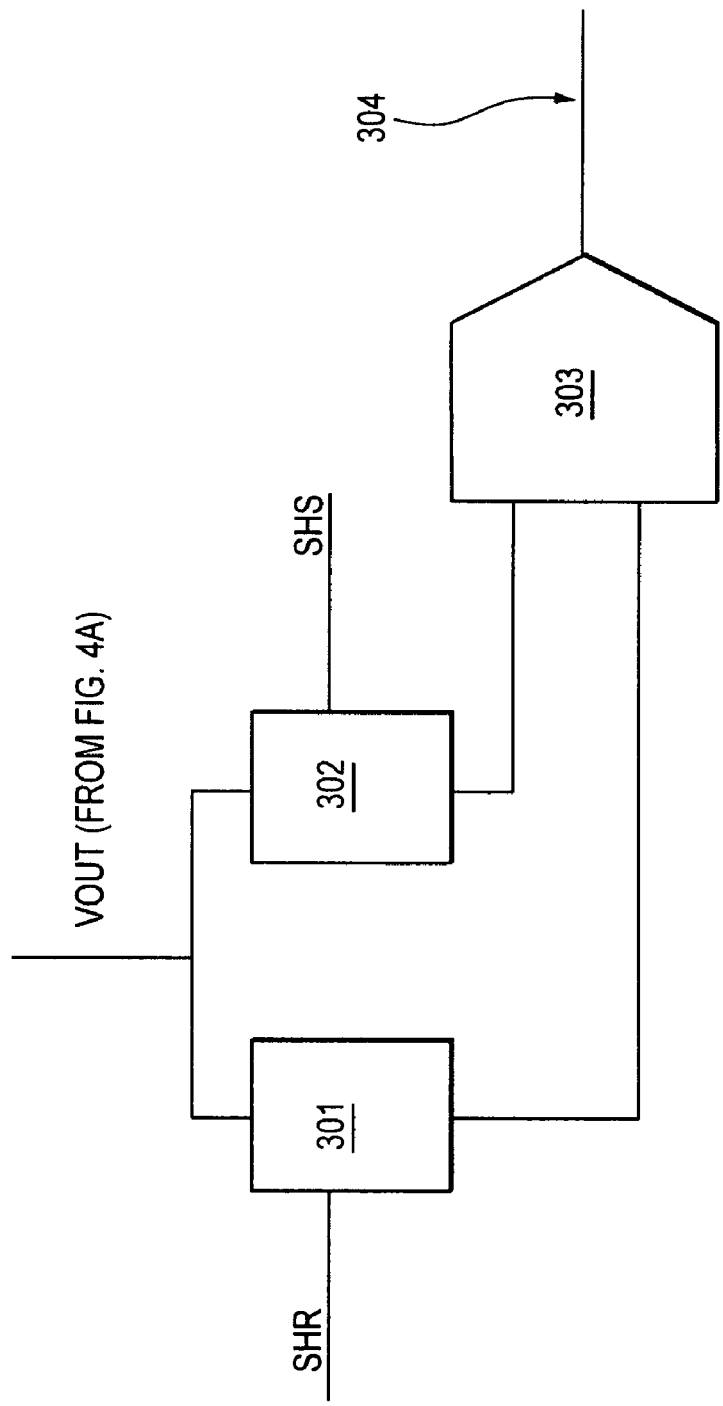
FIG. 4B is a diagram of analog processing circuits according to an embodiment described herein.

FIG. 4A is a schematic diagram of the embodiment of FIG. 3B. Additionally, FIG. 4B is a schematic diagram of circuits to handle sampling and analog processing on the output signals VOUT from the circuit portion of FIG. 4A. Reset sample circuit 301 and signal sample circuit 302 store the value of the VOUT signal (from FIG. 4A) responsive to the SHR and SHS signals, respectively. The values held by reset sample circuit 301 and signal sample circuit 302 are subtracted by differential amplifier 303. The resulting signal is supplied via output line 304 to other circuits for amplification, digitization, and other processes. In FIGS. 4A and 4B, all control signals have been designated to correspond to the timing diagram shown in FIG. 5. The operation of these elements is discussed below in conjunction with FIG. 5.

Figure 5:
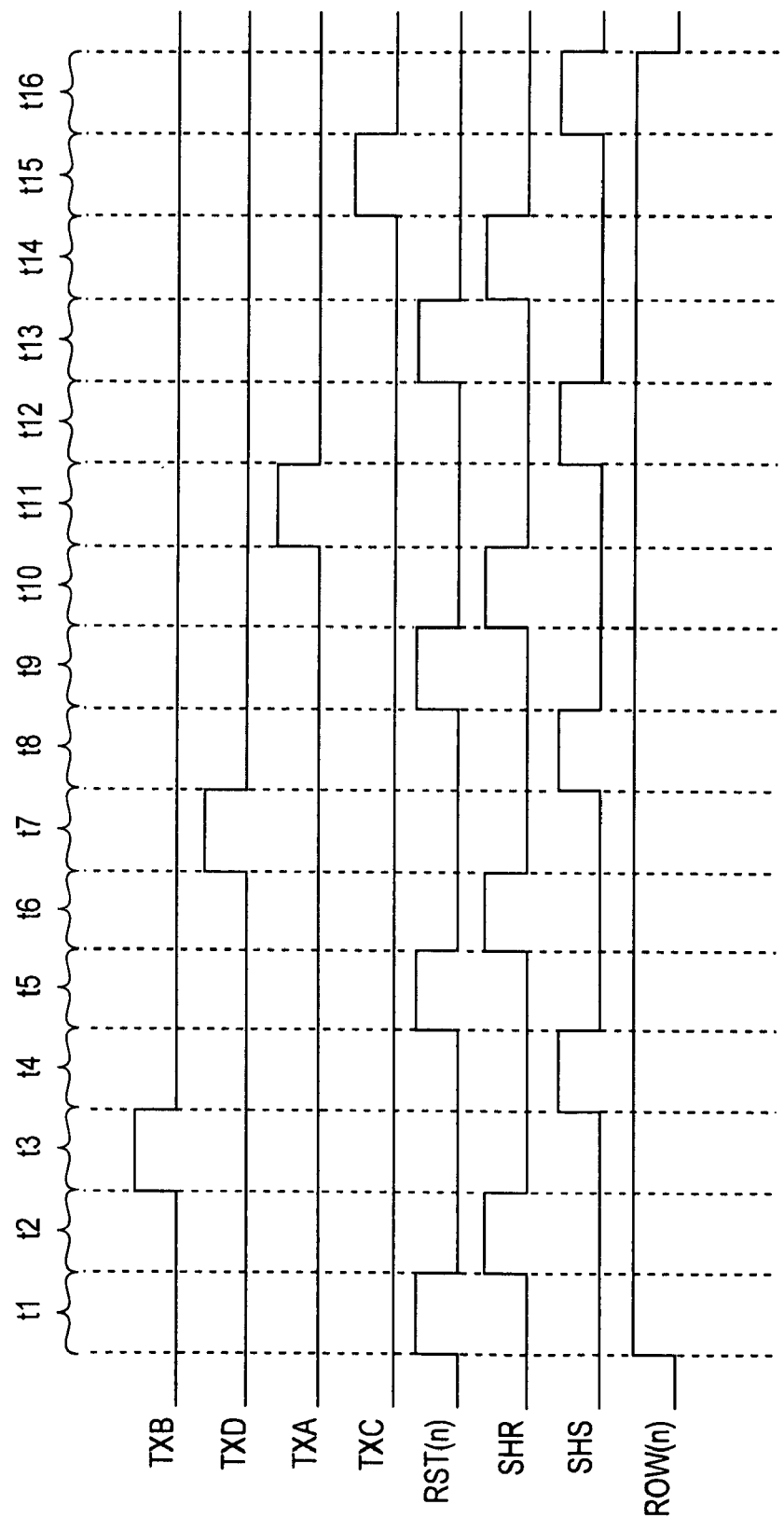
FIG. 5 is a timing diagram corresponding to the four-pixel block of FIG. 3A.

FIG. 5 shows a timing diagram of an example operation of pixel block 200 (FIGS. 3A, 3B, 4A, and 4B) and readout sample and hold circuitry during a readout cycle. After an image has been exposed to the image sensor containing pixel block 200, the readout cycle begins as the ROW(n) signal is activated. ROW(n) remains activated throughout the entire readout process for pixel block 200 (in FIG. 5, all signals are depicted as high when activated). During time t1, the RST(n) signal is activated, which allows charge to flow from the voltage supply line 206 (FIG. 4A) to reset the charge of the floating diffusion region FD. This charge is converted into a voltage VRST by source follower transistor 110 (FIGS. 3B and 4A) and is passed through the row select transistor 112 (FIGS. 3B and 4A) as signal VOUT. At time t2, RST(n) is deactivated to disconnect the floating diffusion region FD from the voltage supply line 206. Also at time t2, SHR is activated, which allows the reset sample circuit 301 to sample and hold the value of VOUT, in this case VRST. After time t2, the reset sample circuit 301 is holding the voltage representing the charge on floating diffusion region FD after it is reset (VRST).

During time t3, TXB is activated, which allows transfer gate 104B (FIG. 3B) to transfer the charge accumulated on photosensor 102B (FIG. 3B) to the floating diffusion region FD. That charge is converted into a voltage VSIG by source follower transistor 110 (FIG. 3B) and passes through row select transistor 112 (FIG. 3B). During time t4, TXB is deactivated and signal SHS is activated, allowing the signal sample circuit 302 (FIG. 4B) to sample and hold the voltage produced by the charge on floating diffusion region FD (FIG. 3B). The difference between the voltages in signal sample circuit 302 (FIG. 4B) and reset sample circuit 301 (FIG. 4B) represents the amount of light that reached photosensor 102A (FIG. 3B) from just prior to time t1 to time t2, thus the two voltages are supplied to differential amplifier 303 (FIG. 4B), which subtracts them to produce the analog signal on line 304 (FIG. 4B). The analog signal on line 304 is received by other components for further processing, such as analog-to-digital conversion, color correction, defect correction, and many other operations. During times t5 through t8, the process above (using TXD to control transfer gate 104D in place of TXB and 104B) is repeated to read out the value of photosensor 102D. Times t9 through t12 represent the same process for a third photosensor 102A (using TXA to control transfer gate 104A), and times t13 through t16 represent the readout process for the fourth photosensor 102C (using TXC to control transfer gate 104C). After all pixels in the nth row are read out, the process is performed for the pixels in the (n+1)th row (using RST(n+1) instead of RST(n) and ROW(n+1) instead of ROW(n)), and so on for each row until all rows have been read out.

Figure 6A:
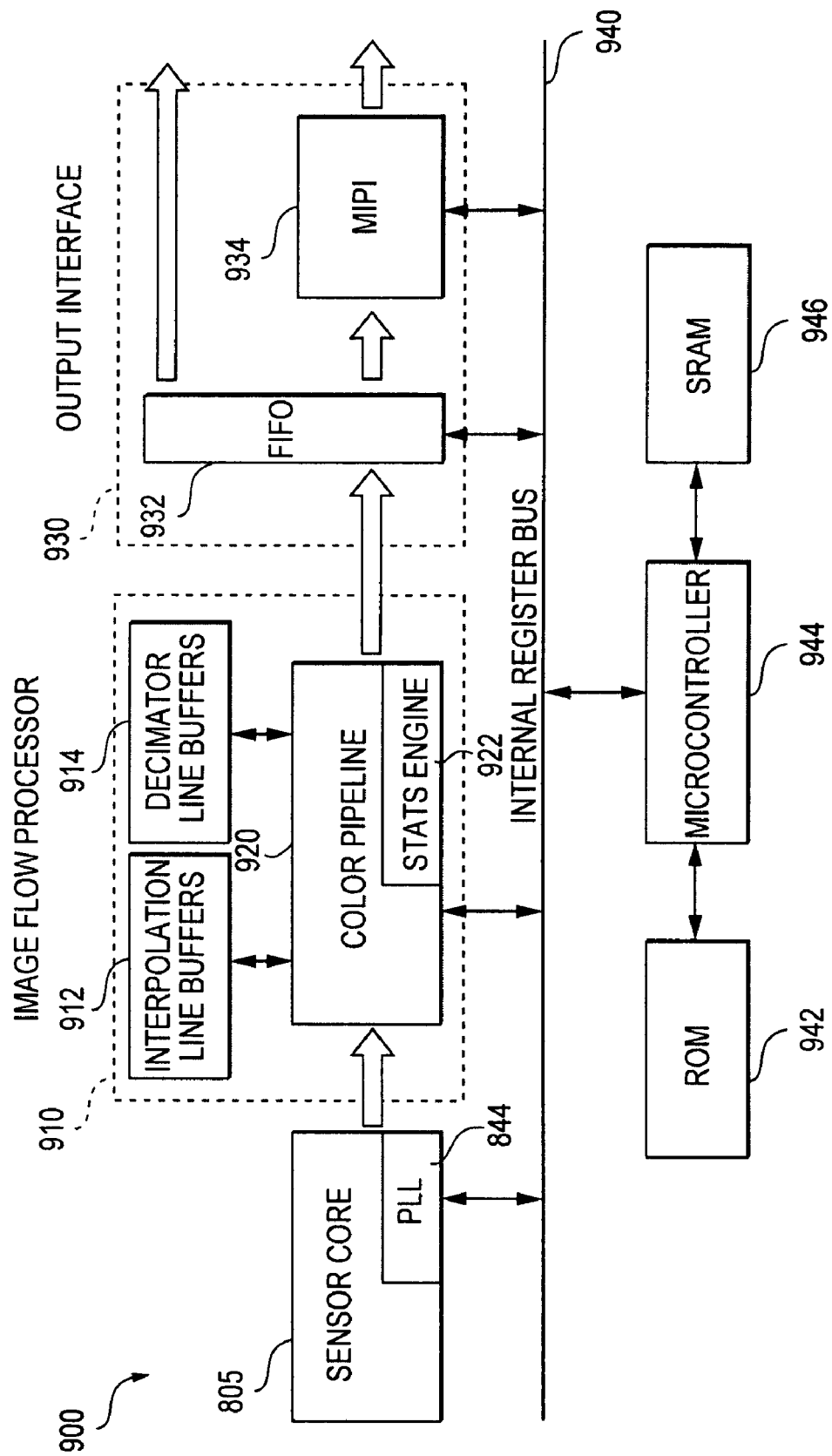
FIG. 6A is a block diagram of system-on-a-chip imaging device constructed in accordance with an embodiment described herein.

FIG. 6A illustrates a block diagram of an exemplary system-on-a-chip (SOC) imaging device 900 constructed in accordance with an embodiment. The imaging device 900 comprises a sensor core 805 that communicates with an image flow processor 910 that is also connected to an output interface 930. A phase locked loop (PLL) 844 is used as a clock for the sensor core 805. The image flow processor 910, which is responsible for image and color processing, includes interpolation line buffers 912, decimator line buffers 914, and a color pipeline 920. One of the functions of the color processor pipeline 920 is to perform pixel processing operations, such as, for example, dark current compensation in accordance with the disclosed embodiments. The color pipeline 920 includes, among other things, a statistics engine 922. The output interface 930 includes an output first-in-first-out (FIFO) parallel output 932 and a serial Mobile Industry Processing Interface (MIPI) output 934. The user can select either a serial output or a parallel output by setting registers within the chip. An internal register bus 940 connects read only memory (ROM) 942, a microcontroller 944 and a static random access memory (SRAM) 946 to the sensor core 805, image flow processor 910 and the output interface 930.

Figure 6B:
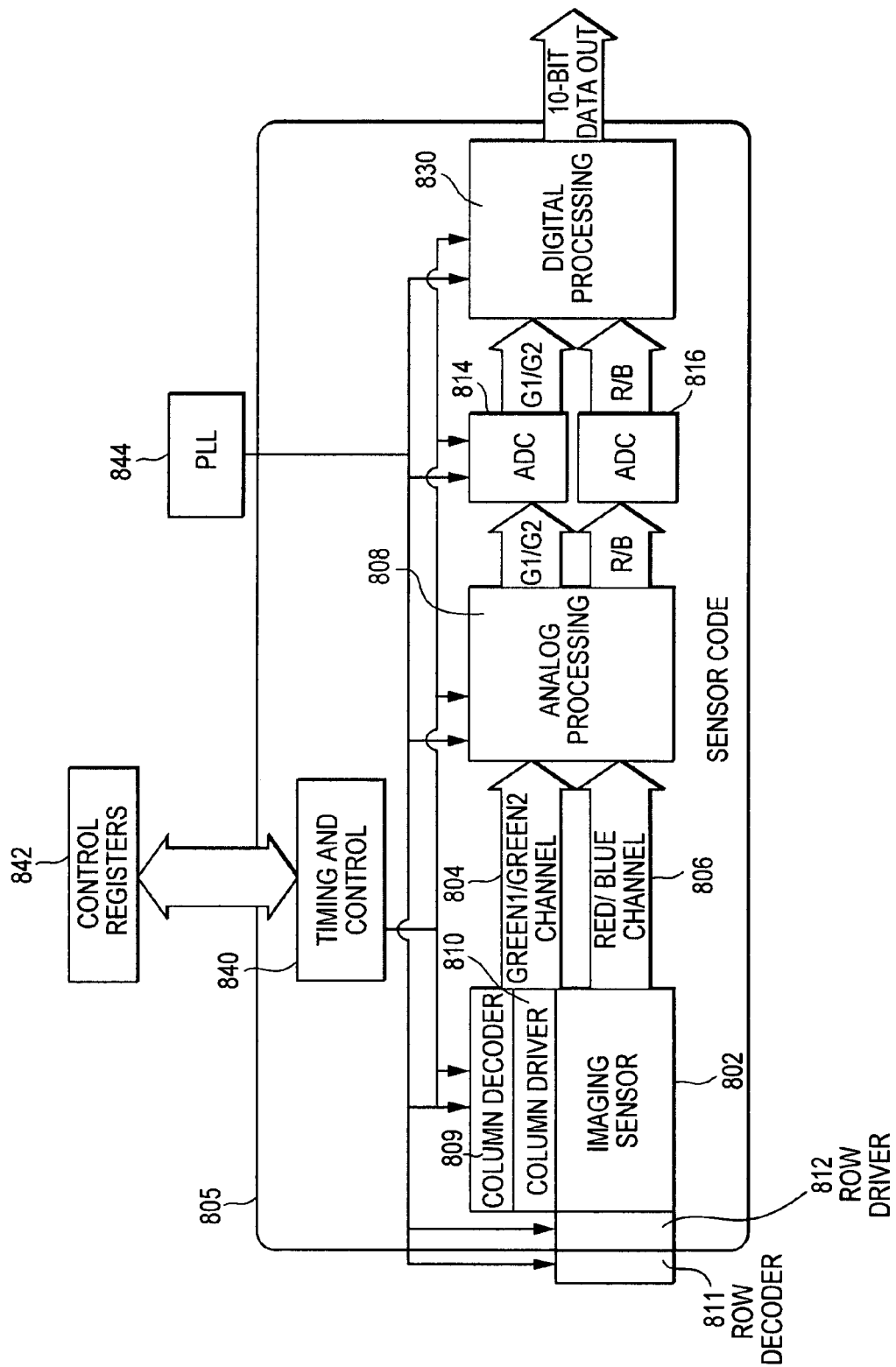
FIG. 6B illustrates an example of a sensor core used in the FIG. 6A device.

FIG. 6B illustrates a sensor core 805 used in the FIG. 6A imaging device 900. The sensor core 805 includes an imaging sensor 802, which is connected to analog processing circuitry 808 by a greenred/greenblue channel 804 and a red/blue channel 806. Although only two channels 804, 806 are illustrated, there are effectively two green channels, one red channel, and one blue channel, for a total of four channels. The greenred (i.e., Green1) and greenblue (i.e., Green2) signals are readout at different times (using channel 804) and the red and blue signals are readouts at different times (using channel 806). The analog processing circuitry 808 outputs processed greenred/greenblue signals G1/G2 to a first analog-to-digital converter (ADC) 814 and processed red/blue signals R/B to a second analog-to-digital converter 816. The outputs of the two analog-to-digital converters 814, 816 are sent to a digital processor 830.

Connected to, or as part of, the imaging sensor 802 are row and column decoders 811, 809 and row and column driver circuitry 812, 810 that are controlled by a timing and control circuit 840. The timing and control circuit 840 uses control registers 842 to determine how the imaging sensor 802 and other components are controlled, for example, controlling the mode of operation of the imaging sensor 802 (e.g., global reset mode or electronic rolling shutter). As set forth above, the PLL 844 serves as a clock for the components in the core 805.

The imaging sensor 802 comprises a plurality of pixel circuits arranged in a predetermined number of columns and rows. In operation, the pixel circuits of each row in imaging sensor 802 are all turned on at the same time by a row select line and the pixel circuits of each column are selectively output onto column output lines by a column select line. A plurality of row and column lines are provided for the entire imaging sensor 802. The row lines are selectively activated by row driver circuitry 812 in response to the row address decoder 811 and the column select lines are selectively activated by a column driver 810 in response to the column address decoder 809. Thus, a row and column address is provided for each pixel circuit. The timing and control circuit 840 controls the address decoders 811, 809 for selecting the appropriate row and column lines for pixel readout, and the row and column driver circuitry 812, 810, which apply driving voltage to the drive transistors of the selected row and column lines.

Each column contains sampling capacitors and switches in the analog processing circuit 808 that read a pixel reset signal VRST and a pixel image signal VSIG for selected pixel circuits. In some embodiments, analog processing circuits 808 contain the signal sample circuit 301, reset sample circuit 302, and differential amplifier 303. Because the core 805 uses greenred/greenblue channel 804 and a separate red/blue channel 806, circuitry 808 will have the capacity to store VRST and VSIG signals for greenred, greenblue, red, and blue pixel signals. A differential signal (VRST−VSIG) is produced by differential amplifiers contained in the circuitry 808 for each pixel. Thus, the signals G1/G2 and R/B are differential signals that are then digitized by a respective analog-to-digital converter 814, 816. The analog-to-digital converters 814, 816 supply digitized G1/G2, R/B pixel signals to the digital processor 830, which forms a digital image output (e.g., a 10-bit digital output). The digital processor 830 performs pixel processing operations. The output is sent to the image flow processor 910 (FIG. 6A).

Although the sensor core 805 has been described with reference to use with a CMOS imaging sensor, this is merely one example sensor core that may be used. Embodiments of the invention may also be used with other sensor cores having a different readout architecture. While the imaging device 900 (FIG. 6A) has been shown as a system-on-a-chip, it should be appreciated that the embodiments are not so limited. Other imaging devices, such as, for example, a standalone sensor core 805 coupled to a separate signal processing chip could be used in accordance with the embodiments.

Figure 7:
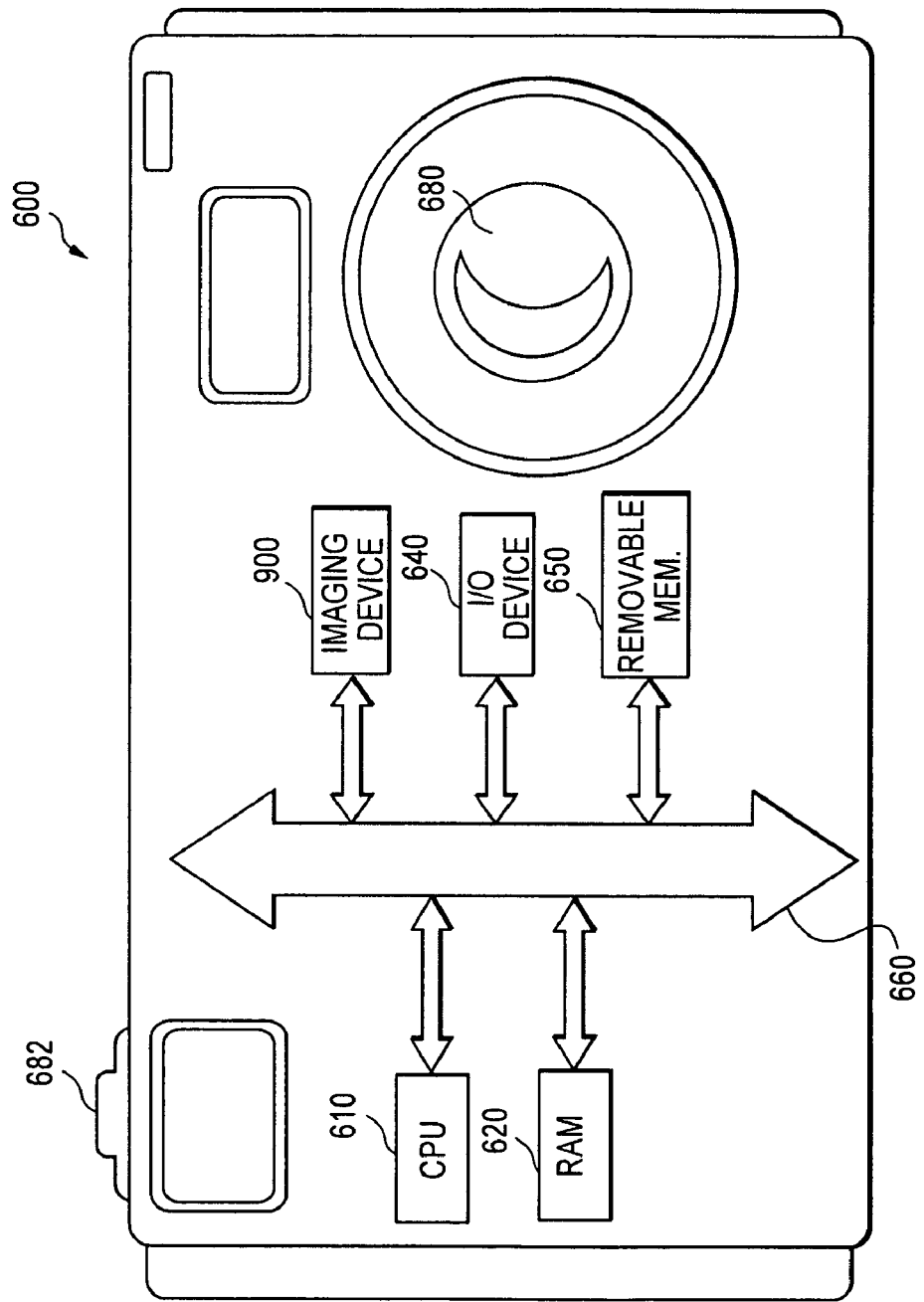
FIG. 7 shows a system incorporating at least one imaging device in accordance with an embodiment described herein.

Additionally, imaging, optical black, and tied pixel data from the imaging sensor 802 (FIG. 6B) can be output from the 10-bit data output (FIG. 6B) and stored and compensated elsewhere, for example, in a system as described in relation to FIG. 7 or in a stand-alone image processing system.

FIG. 7 shows a typical system 600, such as, for example, a camera. The system 600 is an example of a system having digital circuits that could include imaging devices 900. Without being limiting, such a system could include a computer system, camera system (such as a digital still camera, digital single-lens reflex camera, or digital video camera), scanner, machine vision, vehicle navigation system, video phone, surveillance system, auto focus system, star tracker system, motion detection system, image stabilization system, and other systems employing an imaging device 900.

System 600, for example, a camera system, includes a lens 680 for focusing an image on the imaging device 900 when a shutter release button 682 is pressed. System 600 generally comprises a central processing unit (CPU) 610, such as a microprocessor that controls camera functions and image flow, and communicates with an input/output (I/O) device 640 over a bus 660. The imaging device 900 also communicates with the CPU 610 over the bus 660. The system 600 also includes random access memory (RAM) 620, and can include removable memory 650, such as flash memory, which also communicates with the CPU 610 over the bus 660. The imaging device 900 may be combined with the CPU 610, with or without memory storage on a single integrated circuit, such as, for example, a system-on-a-chip, or on a different chip than the CPU 610. As described above, uncompensated data from the imaging sensor 802 (FIG. 6B) can be output from the imaging device 900 and stored, for example in the random access memory 620 or the CPU 610.

While the embodiments have been described in detail in connection with preferred embodiments known at the time, it should be readily understood that the claimed invention is not limited to the disclosed embodiments. Rather, the embodiments can be modified to incorporate any number of variations, alterations, substitutions, or equivalent arrangements not heretofore described. For example, while the embodiments are described in connection with a CMOS imaging sensor, they can be practiced with other types of imaging sensors. Additionally, three or five channels, or any number of color channels may be used, rather than four, for example, and they may comprise additional or different colors/channels than greenred, red, blue, and greenblue, such as e.g., cyan, magenta, yellow (CMY); cyan, magenta, yellow, black (CMYK); or red, green, blue, indigo (RGBI).

What is claimed as new and desired to be protected by Letters Patent of the United States is:

1. A pixel array comprising:
   a plurality of pixel blocks organized into rows and columns, each block comprising:
      first, single, second, third, and fourth pixels, each pixel having a respective photosensor for generating photocharges;
      a common unitary floating diffusion region shared by the photosensors of the first, second, third, and fourth pixels for storing the generated photocharges from each of the photosensors;
      a shared readout circuit connected to said common floating diffusion region; and
      first, second, third, and fourth rectilinear transfer gates for selectively transferring photocharges from a photosensor of an associated pixel to the first common floating diffusion region;
   wherein each of the transfer gates overlaps an edge of the photosensor in its associated pixel and an edge of a photosensor outside the pixel block and transfers photocharge from the photosensor outside the pixel block to a second common floating diffusion; and
   wherein said shared readout circuit of a first block is provided between a first pair of photosensors of said first block which are in adjacent pixels rows and a readout circuit of a second block is provided between a second pair of photosensors of said first block which are in adjacent pixel rows.

2. The pixel array of claim 1, wherein each of the transfer gates is oriented parallel to the edge of a photosensor which it overlaps.

3. The pixel array of claim 1 further comprising a reset transistor for resetting the charges stored at the common unitary floating diffusion region.

4. The pixel array of claim 1, wherein the shared readout circuit includes a common source follower transistor having a gate connected to said common unitary floating diffusion region and a common row select transistor for gating the output of said source follower transistor.

5. The pixel array of claim 4, wherein two of the first, second, third and fourth pixels are adjacent pixels in a column of the array.

6. The pixel array of claim 4, wherein a single electrical contact is provided between said source follower transistor gate and the common unitary floating diffusion region.

7. The pixel array of claim 1, wherein two of the first, second, third and fourth pixels are two adjacent pixels in a row of the array.

8. The pixel array of claim 1, wherein the shared readout circuit is located in an active region located between a first and second pair of photosensors.

9. The pixel array of claim 1, wherein said common unitary floating diffusion region is centrally located with respect to the photosensors of said first, second, third and fourth pixels.

10. The pixel array of claim 1, wherein said transfer gates extend in the direction of a column of said array such that each transfer gate overlaps an entire edge of the photosensor in its associated pixel block and an entire edge of a photosensor in another pixel block.

11. The pixel array of claim 1, wherein said first and second pixels are in a first pixel row of said pixel array and said third and fourth pixels are in a second adjacent pixel row of said pixel array and each of said transfer gates extends to overlap photosensors of pixels in a pixel row of said pixel array other than said first and second pixel rows.

12. The pixel array of claim 1, wherein each of said transfer gates has a rectangular shape.

13. The pixel array of claim 1, wherein each said transfer gate extends along an entire edge of an associated photosensor of a block.

14. The pixel array of claim 1, wherein said transfer gates have a rectangular shape and are aligned such that their respective lengths are oriented in the same direction as pixel columns.

15. An imager comprising:
   a plurality of pixel blocks organized into rows and columns, each block comprising:
      first, second, third, and fourth photosensors for generating photocharges in response to light;
      a common unitary floating diffusion region shared by the first, second, third, and fourth photosensors;
      first, second, third, and fourth rectangular transfer gates, each having a length and width, for transferring photocharges to the common floating diffusion region from a respective one of the first, second, third, and fourth photosensors;

a common reset transistor for resetting the charge at the common floating diffusion region; and a readout circuit comprising at least one common transistor for producing at least one signal representing an amount of charge stored at the common storage node, at least a portion of the readout circuit being located in an active region between the first, second, third, and fourth photosensors;

wherein each of the transfer gates overlaps along its length an edge of its first associated photosensor and an edge of a second associated photosensor in an adjacent block; and wherein said readout circuit of a first block is provided between a first pair of photosensors of said first block which are in adjacent pixels rows and a readout circuit of a second block is provided between a second pair of photosensors of said first block which are in adjacent pixel rows.

16. The imager of claim 15, wherein the second associated photosensor is in the same column as the first associated photosensor.

17. The imager of claim 15, wherein the first, second, third or fourth photosensors each comprise a photodiode.

18. An imaging system comprising:
a pixel array comprising:
  a plurality of pixel blocks organized into rows and columns, each block comprising:
    first, second, third, and fourth pixels, each pixel having a respective photosensor for generating photocharges;
    a common unitary floating diffusion region shared by respective photosensors of the first, second, third, and fourth pixels for storing the generated photocharges;
    a shared readout circuit connected to said common floating diffusion region; and
    first, second, third, and fourth rectilinear transfer gates for transferring photocharges to the common unitary floating diffusion region from a respective one of the first, second, third, and fourth photosensors;
  wherein each photosensor is connected to a ground contact;
  wherein each of the transfer gates overlaps an entire edge of the photosensor in its associated pixel and the common unitary floating diffusion region;
  wherein each of the transfer gates overlaps a photosensor in an adjacent pixel block and a second common floating diffusion region in the adjacent pixel block; and
  wherein said shared readout circuit of a first block is provided between a first pair of photosensors of said first block which are in adjacent pixels rows and a readout circuit of a second block is provided between a second pair of photosensors of said first block which are in adjacent pixel rows.

19. The imaging system of claim 18, wherein each photosensor is a PNP-type photodiode, and the N-region of each photodiode is electrically grounded.

20. The imaging system of claim 18, wherein the imaging system is part of a digital camera.

21. The imaging system of claim 18, wherein the imaging system is part of a digital single-lens reflex camera.

22. The imaging system of claim 18, wherein the imaging system is part of a digital video camera.

* * * * *